United States Patent
Cok

(10) Patent No.: US 7,952,105 B2
(45) Date of Patent: *May 31, 2011

(54) LIGHT-EMITTING DISPLAY DEVICE HAVING IMPROVED EFFICIENCY

(75) Inventor: Ronald S. Cok, Rochester, NY (US)

(73) Assignee: Global OLED Technology, LLC., Wilmington, DE (US)

( * ) Notice: Subject to any disclaimer, the term of this patent is extended or adjusted under 35 U.S.C. 154(b) by 861 days.

This patent is subject to a terminal disclaimer.

(21) Appl. No.: 11/668,039

(22) Filed: Jan. 29, 2007

(65) Prior Publication Data

US 2008/0180020 A1      Jul. 31, 2008

(51) Int. Cl.
*H01L 27/15* (2006.01)

(52) U.S. Cl. ....... 257/79; 257/13; 257/98; 257/E33.055; 977/774

(58) Field of Classification Search .................... 257/13, 257/98, 40; 313/503–505, 509; 977/773, 977/774; 428/690, 917
See application file for complete search history.

(56) References Cited

U.S. PATENT DOCUMENTS

| | | | |
|---|---|---|---|
| 5,958,573 A * | 9/1999 | Spitler et al. | 428/323 |
| 6,238,581 B1 | 5/2001 | Hawkins et al. | |
| 6,307,663 B1 | 10/2001 | Kowarz | |
| 6,663,788 B2 | 12/2003 | Kowarz et al. | |
| 7,012,363 B2 * | 3/2006 | Weaver et al. | 313/504 |
| 7,417,370 B2 | 8/2008 | Cok | |
| 7,564,063 B2 | 7/2009 | Cok | |
| 2005/0194896 A1 * | 9/2005 | Sugita et al. | 313/506 |
| 2006/0049745 A1 * | 3/2006 | Handa et al. | 313/503 |
| 2007/0069202 A1 * | 3/2007 | Choi et al. | 257/40 |

FOREIGN PATENT DOCUMENTS

WO      2005/055330      6/2005

OTHER PUBLICATIONS

Organic electroluminescent diodes, by C.W. Tang et al., Applied Physics Letter 51, Sep. 21, 1987, American Institute of Physics, pp. 913-915.

Electroluminescence from heterostructures of poly(phenylene vinylene) and inorganic CdSe nanocrystals, by Mattoussi et al., Journal of Applied Physics, vol. 83, No. 12, Jun. 15, 1998, p. 7965.

Study of conduction mechanism and Electroluminescence in CdSe/ZnS quantum dot composites, by Hikmet et al., Journal of Applied Physics, vol. 93, No. 6, Mar. 15, 2003, p. 3509.

(Continued)

*Primary Examiner* — Kiesha R Bryant
*Assistant Examiner* — Mark W Tornow
(74) *Attorney, Agent, or Firm* — McKenna Long & Aldridge, LLP.

(57) ABSTRACT

A light-emissive device includes a substrate having a first electrode formed on the substrate. A colloidal light-emitting layer comprising inorganic, light-emissive particles is formed over the first electrode. A second electrode is formed over the light-emitting layer. At least one of the first and second electrodes is transparent. The transparent electrode preferably has a refractive index substantially equal to or greater than the refractive index of the colloidal light-emitting layer. Finally, a light-scattering layer is formed on a side of the transparent electrode opposite the colloidal light-emitting layer.

9 Claims, 8 Drawing Sheets

OTHER PUBLICATIONS

Multicolor light-emitting diodes based on seminconductor nanocrystals encapsulated in GaN charge injection layers, by Mueller et al., Nano Letters, vol. 5, No. 6, 2005, pp. 1039-1044.

Electroluminescence from single monolayers of nanocrystals in molecular organic devices, by Coe et al., Nature, vol. 420, Dec. 19, 2002, pp. 800-803.

Light-emitting diodes based on conjugated polymers, By Burroughes et al., Nature, vol. 347, Oct. 11, 1990., pp. 539-541.

U.S. Appl. No. 11/226,622, filed Sep. 14, 2005, Kahen.

Nakamura et al., "Bright Electroluminescence from CdS Quantum Dot LED Structures", Electronics Letter, vol. 34, No. 25, pp. 2435-2436, 1998.

Rossetti et al., "Quantum Size Effects in the Redox Potentials, Resonance Raman Spectra, and Electronic Spectra of CdS Crystallites in Aqueous Solution", Journal of Chemical Physics, vol. 79, No. 2, pp. 1086-1088, 1983.

Xie et al., "Synthesis and Characterization of Highly Luminescent CdSe—Core $CdS/Zn_{0.5}Cd_{0.5}S/ZnS$ Multishell Nanocrystals", Journal of the American Chemical Society, vol. 127, pp. 7480-7488, 2005.

Peng et al., "Epitaxial Growth of Highly Luminescent CdSe/CdS Core/Shell Nanocrystals with Photostability and Electronic Accessibility", Journal of the American Chemical Society, vol. 119, pp. 7019-7029, 1997.

Masala et al., "Synthesis Routes for Large Volumes of Nanoparticles", Annual Review of Materials Research, vol. 34, pp. 41-81, 2004.

Bol et al., "Factors Influencing the Luminescence Quantum Efficiency of Nanocrystalline $ZnS : Mn^{2+}$", Phys. Stat. Sol., vol. B224, pp. 291-296, 2001.

Rossetti et al., "Size Effects in the Excited Electronic States of Small Colloidal CdS Crystallites", Journal of Chemical Physics, vol. 80, No. 9, pp. 4464-4469, 1984.

Hines et al., "Synthesis and Characterization of Strongly Luminescing ZnS-Capped CdSe Nanocrystals", Journal of Physical Chemistry, vol. 100, pp. 468-471, 1996.

Kortan et al., "Nucleation and Growth of CdSe on ZnS Quantum Crystallite Seeds, and Vise Versa, in Inverse Micelle Media", Journal of the American Chemical Society, vol. 112, pp. 1327-1332, 1990.

Murray et al., "Synthesis and Characterization of Monodisperse Nanocrystals and Close-Packed Nanocrystal Assemblies", Annual Review of Materials Science, vol. 30, pp. 545-610, 2000.

Goldstein et al., "Melting in Semiconductor Nanocrystals", Science, vol. 256, pp. 1425-1427, 1992.

Qadri et al., "Size-induced transition-temperature reduction in nanoparticles of ZnS", Physical Review, vol. 60, No. 13, pp. 9191-9193, 1999.

Ivanov et al., "Light Amplification Using Inverted Core/Shell Nanocrystals: Towards Lasing in the Single-Exciton Regime", Journal of Physical Chemistry, vol. 108, pp. 10625-10630, 2004.

Talapin et al., "CdSe/CdS/ZnS and CdSe/ZnSe/ZnS Core-Shell—Shell Nanocrystals", Journal of Physical Chemistry, vol. 108, pp. 18826-18831, 2004.

Kahen, "Rigorous Optical Modeling of Multilayer Organic Light-Emitting Diode Devices", Applied Physics Letters, vol. 78, No. 12, pp. 1649-1651, 2001.

Lim, "High p-type doping of ZnSe using $Li_3N$ diffusion", Applied Physics Letters, vol. 65, No. 19, pp. 2437-2438, 1994.

George et al., "Doping of Chemically Deposited Intrinsic CdS Thin Films to n Type by Thermal Diffusion of Indium", Applied Physics Letters, vol. 66, No. 26, pp. 3624-3626, 1995.

Hines et al., "Bright UV-Blue Luminescent Colloidal ZnSe Nanocrystals", Journal of Physical Chemistry, vol. 102, No. 19 pp. 3655-3657, 1998.

Lee et al., "Electrical and Optical Properties of Boron Doped CdS Thin Films Prepared by Chemical Bath Deposition", Thin Solid Films 431-432, pp. 344-348, 2003.

* cited by examiner

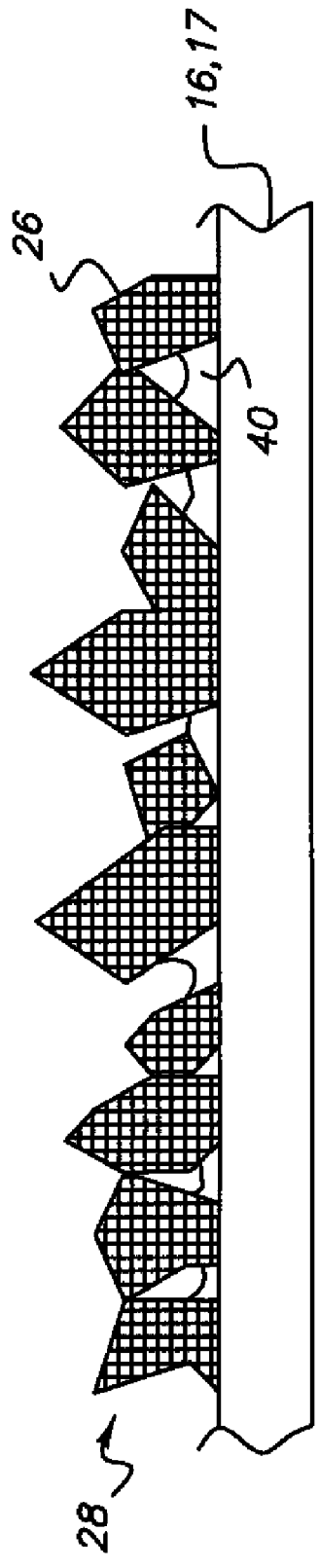
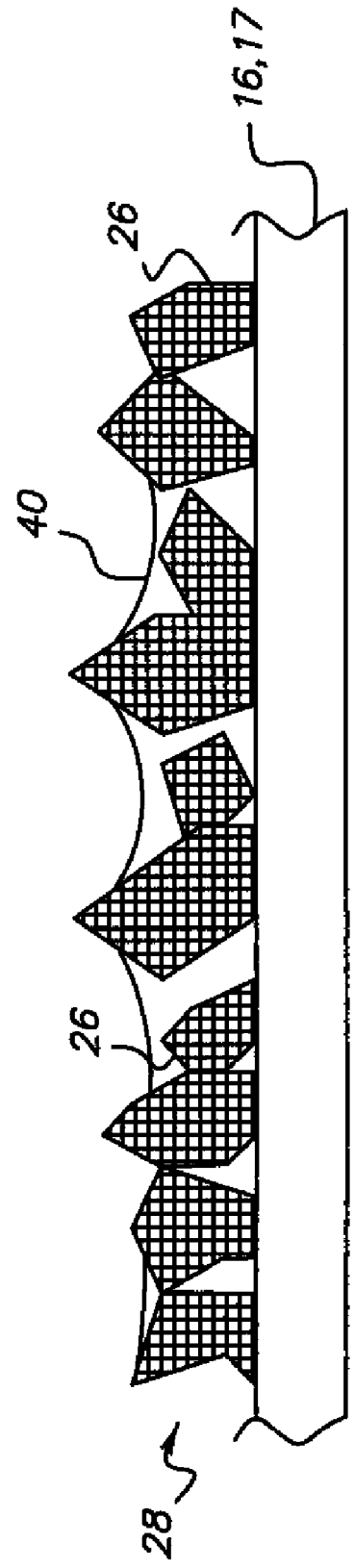

LIGHT-EMITTING DISPLAY DEVICE HAVING IMPROVED EFFICIENCY

FIELD OF THE INVENTION

The present invention relates to inorganic LED display devices including color change materials and quantum dots, and more particularly, to device structures for improving the optical efficiency of such display devices.

BACKGROUND OF THE INVENTION

Semiconductor light emitting diode (LED) devices, which are primarily inorganic, have been made since the early 1960's and currently are manufactured for usage in a wide range of consumer and commercial applications. The layers comprising the LEDs are based on crystalline semiconductor materials. These crystalline-based inorganic LEDs have the advantages of high brightness, long lifetimes, and good environmental stability. The crystalline semiconductor layers that provide these advantages also have a number of disadvantages. The dominant ones have high manufacturing costs; difficulty in combining multi-color output from the same chip; efficiency of light output; and the need for high-cost rigid substrates.

In the mid 1980's, organic light-emitting diodes (OLEDs) were invented (Tang et al, Applied Physics Letter 51, 913 (1987)) based on the usage of small molecular weight molecules. In the early 1990's, polymeric LEDs were invented (Burroughs et al., Nature 347, 539 (1990)). In the ensuing 15 years organic-based LED displays have been brought out into the marketplace and there has been great improvements in device lifetime, efficiency, and brightness. For example, devices containing phosphorescent emitters have external quantum efficiencies as high as 19%; whereas, device lifetimes are routinely reported at many tens of thousands of hours. However, in comparison to crystalline-based inorganic LEDs, OLEDs suffer reduced brightness, shorter lifetimes, and require expensive encapsulation for device operation.

To improve the performance of OLEDs, in the late 1990's OLED devices containing mixed emitters of organics and quantum dots were introduced (Mattoussi et al., Journal of Applied Physics 83, 7965 (1998)). Quantum dots are light-emitting nano-sized semiconductor crystals. Adding quantum dots to the emitter layers could enhance the color gamut of the device; red, green, and blue emission could be obtained by simply varying the quantum dot particle size; and the manufacturing cost could be reduced. Because of problems such as aggregation of the quantum dots in the emitter layer, the efficiency of these devices was rather low in comparison with typical OLED devices. The efficiency was even poorer when a neat film of quantum dots was used as the emitter layer (Hikmet et al., Journal of Applied Physics 93, 3509 (2003)). The poor efficiency was attributed to the insulating nature of the quantum dot layer. Later the efficiency was boosted (to ~1.5 cd/A) upon depositing a mono-layer film of quantum dots between organic hole and electron transport layers (Coe et al., Nature 420, 800 (2002)). It was stated that luminescence from the quantum dots occurred mainly as a result of Forster energy transfer from excitons on the organic molecules (electron-hole recombination occurs on the organic molecules). Regardless of any future improvements in efficiency, these hybrid devices still suffer from all of the drawbacks associated with pure OLED devices.

Recently, a mainly all-inorganic LED was constructed (Mueller et al., Nano Letters 5, 1039 (2005)) by sandwiching a monolayer thick core/shell CdSe/ZnS quantum dot layer between vacuum deposited inorganic n- and p-GaN layers. The resulting device had a poor external quantum efficiency of 0.001 to 0.01%. Part of that problem could be associated with the organic ligands of trioctylphosphine oxide (TOPO) and trioctylphosphine (TOP) that were reported to be present post growth. These organic ligands are insulators and would result in poor electron and hole injection onto the quantum dots. In addition, the remainder of the structure is costly to manufacture, due to the usage of electron and hole semiconducting layers grown by high-vacuum techniques, and the usage of sapphire substrates.

As described in co-pending, commonly assigned U.S. Ser. No. 11/226,622 by Kahen, which is hereby incorporated by reference in its entirety, additional conducting particles may be provided with the quantum dots in a layer to enhance the conductivity of the light-emitting layer.

Quantum dot light-emitting diode structures may be employed to form flat-panel displays. Likewise, colored-light or white-light lighting applications are of interest. Different materials may be employed to emit different colors and the materials may be patterned over a surface to form full-color pixels. In various embodiments, the quantum dot LEDs may be electronically or photonically stimulated and may be mixed or blended with a light-emitting organic host material and located between two electrodes.

Referring to FIG. 13, a prior-art structure employing electronic stimulation uses a substrate 10 on which is formed a first electrode 12, a light-emissive layer 33 of quantum dots 18 dispersed in an organic light-emitting medium 31, and a second electrode 16. Upon the application of a current from the electrodes, electrons and holes injected into the matrix create excitors that are transferred to the quantum dots for recombination, thereby stimulating the quantum dots to produce light. Such a design is described in WO 2005/055330, by Hikmet et al., published Jun. 16, 2005. P-type and/or an n-type organic transport, charge injection, and/or charge blocking layers 22 and 24 respectively may be optionally employed to improve the efficiency of the device. Typically, one electrode will be reflective (e.g. second electrode 16) while the other may be transparent (e.g. first electrode 12). No particular order is assumed for electrodes 12 and 16, although they are referenced throughout in this document as first and second, respectively.

While quantum dots may be useful and stable light emitters, in prior-art designs the emitted light may be trapped within the light-emitting structure employed to provide current or photo-stimulation to the quantum dots. Due to the high optical indices of the materials used, most of the photons generated by the recombination process are actually trapped in the devices due to total internal reflection. These trapped photons never leave the devices and make no contribution to the light output from these devices. Because light is emitted in all directions from the light-emitting layer, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner.

In the prior-art example of FIG. 13, electrode 12 is transparent and may be typically formed from metal oxides such as indium tin oxide (ITO) having an optical index of 1.8-2.0. Light-emitting organic materials 31 have optical indices of approximately 1.7. P-type and/or n-type organic transport layers 22 and 24, respectively, optionally employed to improve charge injection, typically have optical indices of approximately 1.65-1.7 for organic materials; inorganic materials typically have indices greater than or equal to 2.0.

Substrates on which light-emitting devices are formed typically comprise glass or plastic, having an optical index of approximately 1.5.

Light emitted in a high-index layer will be trapped due to total internal reflection when the light encounters a low-index layer. Referring to FIG. 14, a prior-art light-emitting device has a transparent substrate 10 with a relatively low optical index, a first transparent electrode 12 having a relatively higher optical index, a light-emitting layer 33 having a relatively higher optical index, and a reflective second electrode 16. Some light emitted from the light-emitting layer 33 will be emitted directly out of the device, through the substrate 10, as illustrated with light ray 1. Other light may also be emitted and internally guided in the substrate 10 and light-emitting layers 33, as illustrated with light ray 2. Alternatively, some light may be emitted and internally guided in the light-emitting layer 33 and the first transparent electrode 12, as illustrated with light ray 3. If the light-emitting layer 33 has an optical index higher than the optical index of the transparent electrode 12, light may also be trapped in the light-emitting layer 33 alone (see, e.g., light ray 4). Light rays 5 emitted toward the reflective second electrode 16 are reflected by the reflective second electrode 16 toward the substrate 10 and then follow one of several light ray paths 1, 2, 3, or 4. Similar light trapping occurs with relatively high-index optional charge-injection or charge-transport layers (not shown in FIG. 14).

There is a need therefore for an improved inorganic light-emitting diode device structure that improves the efficiency of the light-emissive display device by releasing more of the heretofore trapped light in the display device.

SUMMARY OF THE INVENTION

In accordance with one embodiment, the invention is directed towards a light-emissive device that includes a substrate with a first electrode formed on the substrate. A colloidal light-emitting layer comprising inorganic, light-emissive particles is formed over the first electrode. A second electrode is formed over the light-emitting layer. At least one of the first and second electrodes is transparent. The transparent electrode preferably has a refractive index substantially equal to or greater than the refractive index of the colloidal light-emitting layer. Finally, a light-scattering layer is formed on a side of the transparent electrode opposite the colloidal light-emitting layer.

Another aspect of the present invention provides a method for making a light-emissive device, including the steps of:

a. providing a substrate;

b. forming a first electrode on the substrate;

c. forming a dispersion comprising inorganic light emissive particles d. coating the dispersion over the first electrode to form a light-emitting layer comprising a colloid of inorganic, light-emissive particles;

e. forming a second electrode over the light-emitting layer;

wherein at least one of the first and second electrodes is transparent and wherein the transparent electrode has a refractive index substantially equal to or greater than the refractive index of the colloidal light-emitting layer; and f. forming a light-scattering layer on a side of the transparent electrode opposite the colloidal light-emitting layer.

Advantages

The present invention has the advantage that it improves the light output of a light-emissive display device employing a light-emissive layer comprising inorganic light-emitting particles.

BRIEF DESCRIPTION OF THE DRAWINGS

FIGS. 10A and 10B are cross sections of a light-scattering layer having a binder according to various embodiment of the present invention;

It will be understood that the figures are not to scale since the individual layers are too thin and the thickness differences of various layers too great to permit depiction to scale.

DETAILED DESCRIPTION OF THE INVENTION

Figure 1:
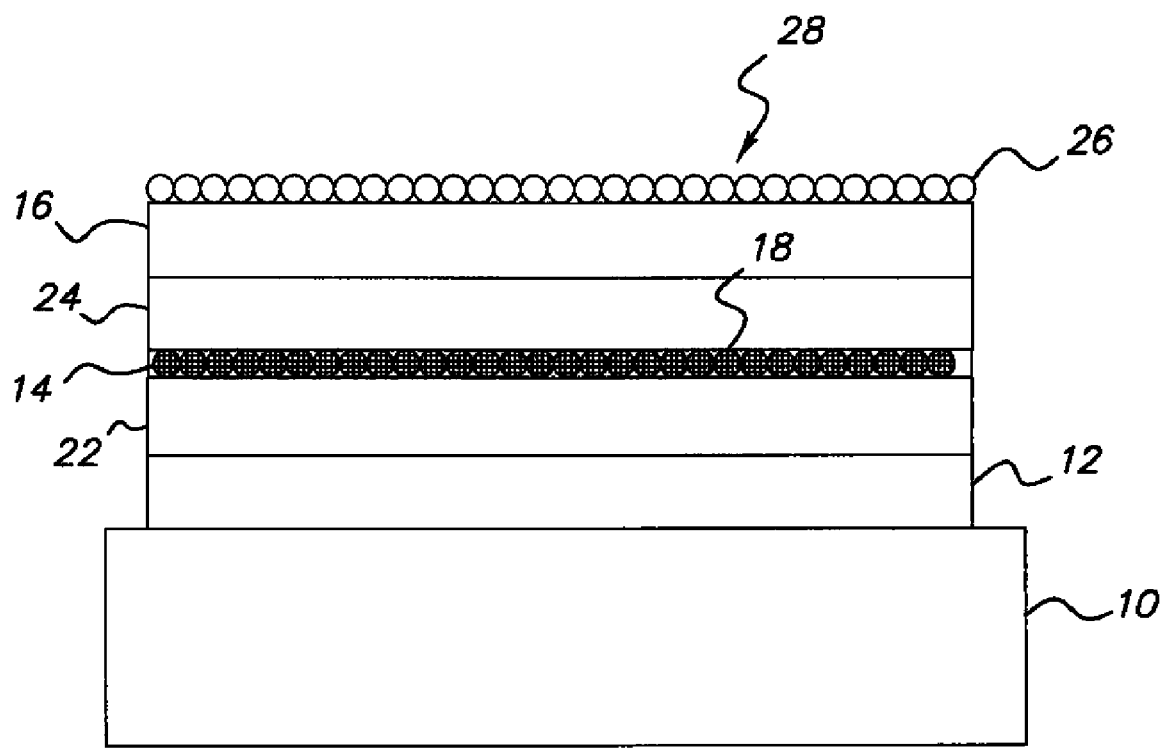
FIG. 1 is a cross section of a light-emissive device according to one embodiment of the present invention.

Referring to FIG. 1, one embodiment of a light-emissive device according to the present invention includes a substrate 10, a first electrode 12 formed on the substrate 10, a colloidal light-emitting layer 14 comprising inorganic, quantum dots 18 formed over the first electrode 12, and a second electrode 16 formed over the colloidal light-emitting layer 14. At least one of the first or second electrodes 12, 16 is transparent. In this embodiment, the first electrode 12 is reflective, while second electrode 16 is transparent and has a refractive index substantially equal to or greater than the refractive index of the colloidal light-emitting layer 14. A light-scattering layer 28 is formed on a side of the transparent electrode 16 opposite the colloidal light-emitting layer 14. The light-scattering layer typically includes transparent particles 26, for example, titanium dioxide such as is known in the art and commercially available. Such light-scattering particles 26 typically have a refractive index of 2.0 or greater. As defined herein, with respect to optical index values substantially equal to means with plus or minus 0.1.

In various further embodiments of the present invention, the light-emissive device may further comprise one or more optional charge-injection, -transport, and/or -blocking layers 22, 24 formed between the colloidal light-emitting layer 14 and either of the electrodes 12, 16. In a further embodiment of the present invention, the electrodes 12, 16 and any optional charge-injection, -transport, and/or -blocking layers 22, 24 formed between the colloidal light-emitting layer 14 and either of the electrodes 12, 16, have a refractive index greater than the refractive index of the substrate 10. According to further embodiments of the present invention, any optional charge-injection, -transport, and/or -blocking layers 22, 24 may have a refractive index substantially greater than or equal to the refractive index of the colloidal light-emitting layer 14 and/or substantially equal to or less than the refractive index of the transparent electrode 16.

In various embodiments of the present invention, electrically conductive transparent layers and/or electrodes may be formed from metal oxides or metal alloys having an optical index of 1.8 or more. For example, organic devices typically employ sputtered indium tin oxide whose optical index may be in the range of 1.8 to 2.0. As taught in the prior art, such a metal oxide with such an optical index will cause a greater amount of light trapping, thereby, reducing the light efficiency of such prior art devices. According to various embodiments of the present invention, a transparent electrode, for example tin oxide, has an optical index greater or equal to optical index of the colloidal light-emissive layer. Hence, a transparent electrode with a greater optical index is preferred and may be formed by additional annealing steps, deposition at higher temperatures, or by employing materials having a greater optical index, as is known in the art. In an inorganic embodiment of the present invention, p-type and/or an n-type charge-injection, -transport, or -blocking layers 22 and 24, respectively, optionally employed to provide charge control, are typically formed from metal alloys and have optical indices of approximately greater than 1.8, while organic materials typically have optical indices of approximately 1.7. Substrates on which light-emitting devices are formed typically comprise glass or plastic, having an optical index of approximately 1.5. Hence, it will generally be the case that the electrodes 12, 16 and any charge-injection, -transport, and/or -blocking layers 22, 24 formed between the colloidal light-emitting layer 14 and either of the electrodes 12, 16, will have a refractive index greater than the refractive index of the substrate 10. Useful material for electrodes includes ITO, CdSe, ZnTe, SnO2, and AlZnO. These materials have typical refractive indices in the range of 1.8 to 2.7. Useful inorganic materials for charge-control layers include CdZnSe and ZnSeTe. In another embodiment of the present invention, the transparent electrode has an optical index greater than or equal to the optical index of the charge-control layers. Organic materials are also known in the art. Reflective electrodes may comprise evaporated or sputtered metals or metal alloys, including Al, Ag, and Mg and alloys thereof. Deposition processes for these materials are known in the art and include sputtering and evaporation. Some materials may also be deposited using ALD or CVD processes, as are known in the art. However, organic materials are more environmentally sensitive and may have limited lifetimes compared to inorganic materials.

Figure 2:
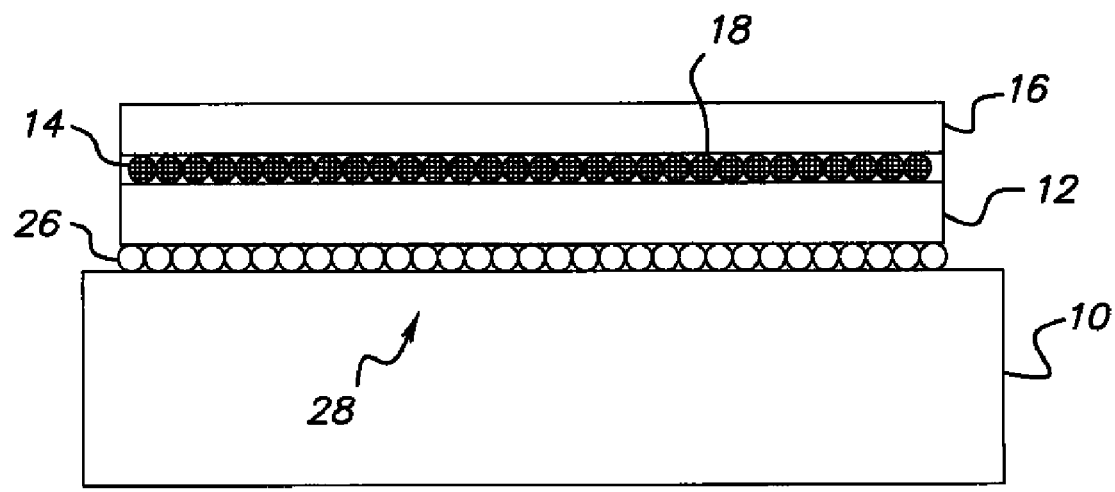
FIG. 2 is a cross section of a light-emissive device according to another embodiment of the present invention.

Referring to FIG. 2, in a bottom-emitter embodiment of the present invention, the substrate 10 and the first electrode 12 are transparent while the second electrode 16 may be reflective so that light may be emitted through the substrate 10. Alternatively, referring back to FIG. 1, in a top-emitter embodiment of the present invention, the substrate 10 may be opaque, the first electrode 12 is reflective, and the second electrode 16 is transparent, so that light is emitted through the second electrode 16 and a transparent cover 20 (FIG. 6, 9) over the second electrode 16.

The light-scattering layer 28 may be variously located, for example, adjacent to the second electrode 16 (in a top-emitter configuration and where second electrode 16 is transparent, as shown in FIG. 1). Alternatively, as shown in FIG. 2, the light-scattering layer 28 may be located adjacent to first electrode 12 (in a bottom-emitter configuration and where first electrode 12 is transparent, as shown in FIG. 2).

As employed herein, a light-scattering layer 28 is an optical layer that tends to randomly redirect any light that impinges on the layer from any direction. As used herein, a transparent electrode is one that passes some light and includes electrodes that are semi-transparent, partially reflective, or partially absorptive. In various embodiments of the present invention, the light-scattering layer 28 may be adjacent to either electrode opposite the colloidal light-emitting layer 14. Light-scattering layer 28 may comprise a volume scattering layer or a surface scattering layer. In certain embodiments, e.g., light-scattering layer 28 may comprise materials having at least two different refractive indices. The light-scattering layer 28 may comprise, e.g., a matrix of lower refractive index and scattering particles 26 having a higher refractive index. Alternatively, the matrix may have a higher refractive index and the scattering particles 26 may have a lower refractive index. For example, the matrix may comprise silicon dioxide or cross-linked resin having indices of approximately 1.5, or silicon nitride with a much higher index of refraction. If light-scattering layer 28 has a thickness greater than one-tenth part of the wavelength of the emitted light, then it is desirable for the index of refraction of at least one material in the light-scattering layer 28 to be approximately equal to or greater than the transparent electrode to which it is adjacent. This is to insure that all of the light trapped in the colloidal light-emitting layer 14 and transparent electrode can experience the direction altering effects of scattering layer 28. If light-scattering layer 28 has a thickness less than one-tenth part of the wavelength of the emitted light, then the materials in the scattering layer need not have such a preference for their refractive indices. In an alternative embodiment, light-scattering layer 28 may comprise particles 26 deposited on another layer, e.g., particles of titanium dioxide may be coated over the transparent electrode to scatter light. Preferably, such particles are at least 100 nm in diameter to optimize the scattering of visible light. Alternatively, light-scattering layer 28 may comprise a rough, diffusely reflecting or refracting surface of an electrode. Scattering particles 26 may be deposited by a variety of methods known in the art, for example, spraying, spinning, or inkjet deposition.

In operation, a current is provided through the electrodes 12 and 16 by electrical control devices (not shown), such as, device drivers and thin-film transistors, thereby causing the excitation of the light-emitting particles 18 and the emission of light. Because the various layers 12, 16, 22, 24 in the device may have a higher refractive index than the substrate 10, emitted light may be trapped in these layers by total internal reflection. Hence, light emitted at a small angle to the substrate 10 normal will be emitted from the device. However, light emitted at a large angle to the substrate 10 normal will be trapped due to total internal reflection at the interface with the relatively lower index substrate 10. Such trapped light is eventually absorbed and contributes to a loss of device efficiency. According to an embodiment of the present invention, the light-scattering particles 26 serve to scatter trapped light out of the device. When trapped light interacts with the light-scattering particles 26, the light may be redirected into an angle at which the light will not experience total internal reflection, therefore increasing the light-emission efficiency of the device. While some light may be scattered into an angle that does experience total internal reflection, the light will eventually re-encounter a light-scattering particle 26 that will redirect the light out of the device, unless it is first absorbed.

Figure 3:
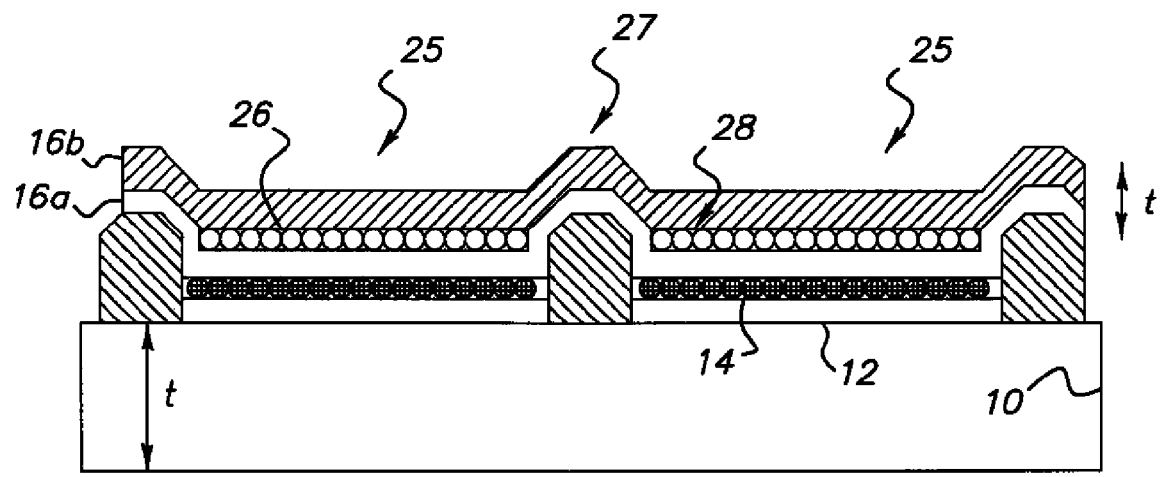
FIG. 3 is a cross section of a light-emissive device according to an alternative embodiment of the present invention.

In other alternative embodiments of the present invention, the first or second electrode 12, 16 may comprise a transparent conductive layer and a reflective layer. Referring to FIG. 3, second electrode 16 comprises a transparent conductive layer 16a and a reflective layer 16b. The reflective layer 16b may be conductive and comprise, for example, metal. In particular, since transparent conductors suffer from reduced conductivity as compared to metals, the reflective layer 16b may have a higher conductivity than the transparent conductive layer 16a. Since the light-emissive particles 18 are stimulated by electrical current, the conductivity of the electrodes is important. The transparent conductive layer 16a is divided into two portions; a first portion 25 over which the scattering layer 28 is formed and a second portion 27 wherein the transparent conductive layer 16a is in electrical contact with the reflective layer 16b. This arrangement enables a highly conductive reflective electrode 16 while locating the light-scattering layer 26 above the layers 12, 14, 22, 24. Since light-scattering layers 28 are typically very rough and may lead to electrical shorts between the electrodes 12, 16, such a location for the light-scattering layer 28 may aid in construction of the device and improve yields.

Figure 4:
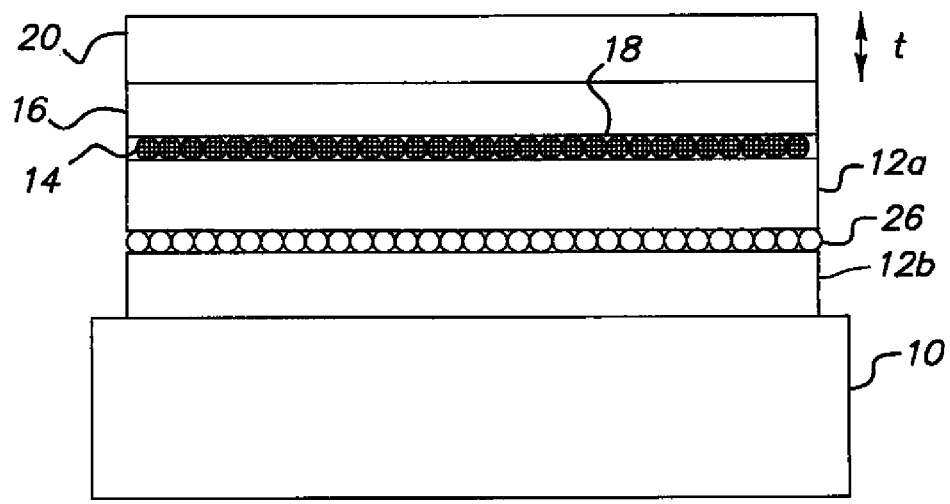
FIG. 4 is a cross section of a light-emissive device having a thin cover and light-scattering particles according to yet another embodiment of the present invention.
Figure 6:
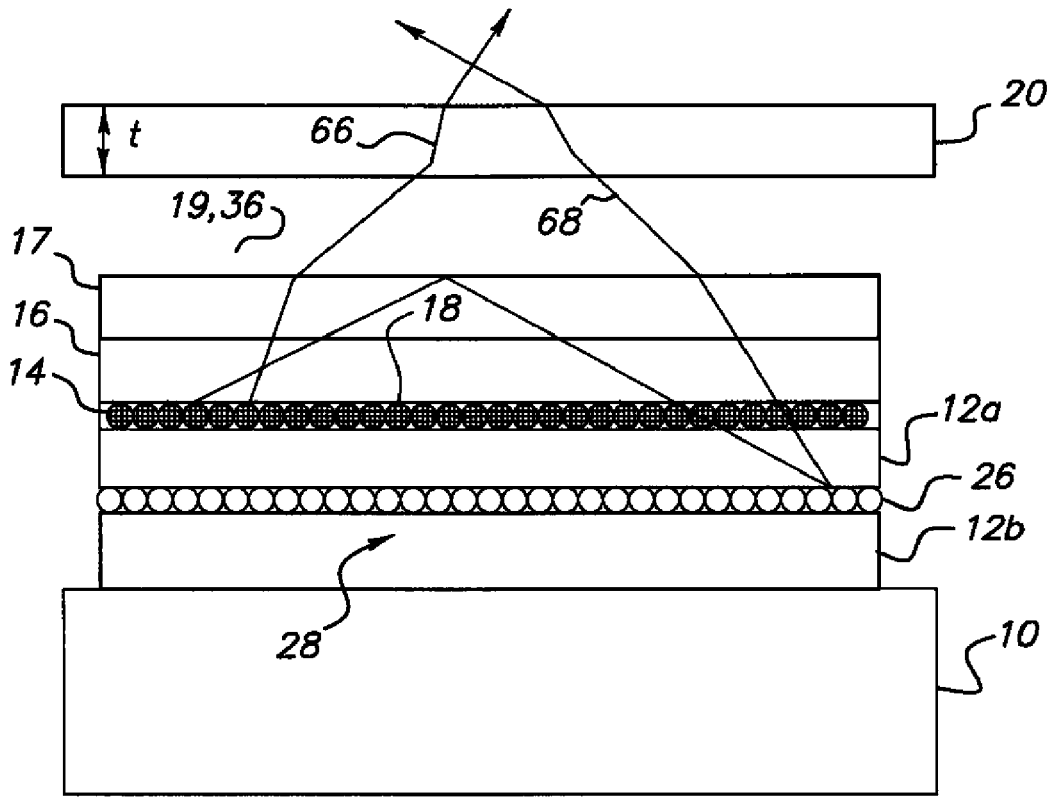
FIG. 6 is a cross section of a top-emitting, light-emissive device having a cover according to an alternative embodiment of the present invention.

Light-scattering layer 28 may be deposited using spin coating, spray coating, or using inkjet deposition, as has been demonstrated by applicant. In particular, the configuration of FIG. 3 may be constructed by first sputtering a transparent, conductive layer 16a, inkjet depositing the scattering layer 26 in only the first locations 25, and then evaporating or sputtering a metal reflective layer 16b over both the light-scattering layer 26 and the transparent, conductive layer 16a to form the reflective layer 16b. Referring to FIGS. 4 and 6, the light-scattering layer 28 may also be located between a conductive transparent layer 12a and a reflective layer 12b. The electrode 12 (or transparent, conductive layer 12a) may be patterned and electrically connected to thin-film electrical components (not shown) comprising an active- or passive-matrix circuit for driving the device. The second electrode 16 (or, if present, transparent conductive layer 16a and reflective layer 16b) may be continuous and unpatterned.

Figure 5:
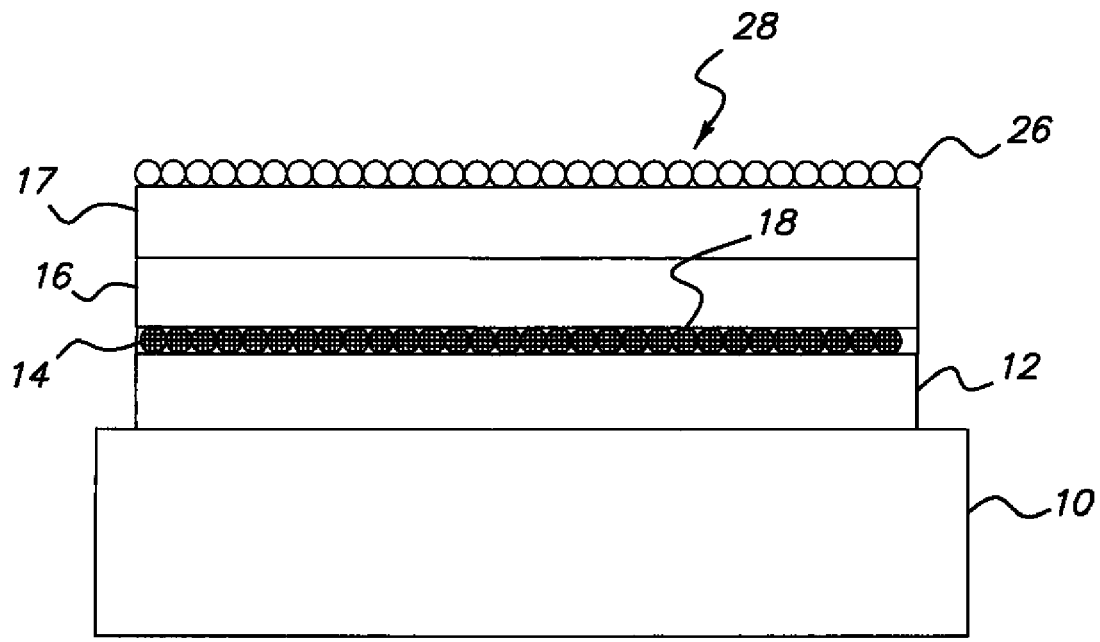
FIG. 5 is a cross section of a light-emissive device having a light-scattering layer according to an alternative embodiment of the present invention.

Referring to FIG. 5, a protective layer 17 may be formed between the transparent, conductive layer 16a (or the electrode 16, particularly if the second electrode 16 is transparent) and the light-scattering layer 28 to protect the layers 12, 14, 22, 24, and 16 (or 16a). Such a protective layer 17 may also be conductive. Useful layers include metal oxides deposited by, for example, by atomic layer deposition (ALD) or chemical vapor deposition (CVD) processes, which are known in the art. If the protective layer 17 is electrically conductive, it may continuously cover the transparent electrode 16 or transparent conductive layer 16a; if the protective layer 17 is not conductive or insufficiently conductive, it may be patterned within the areas 25.

Figure 9:
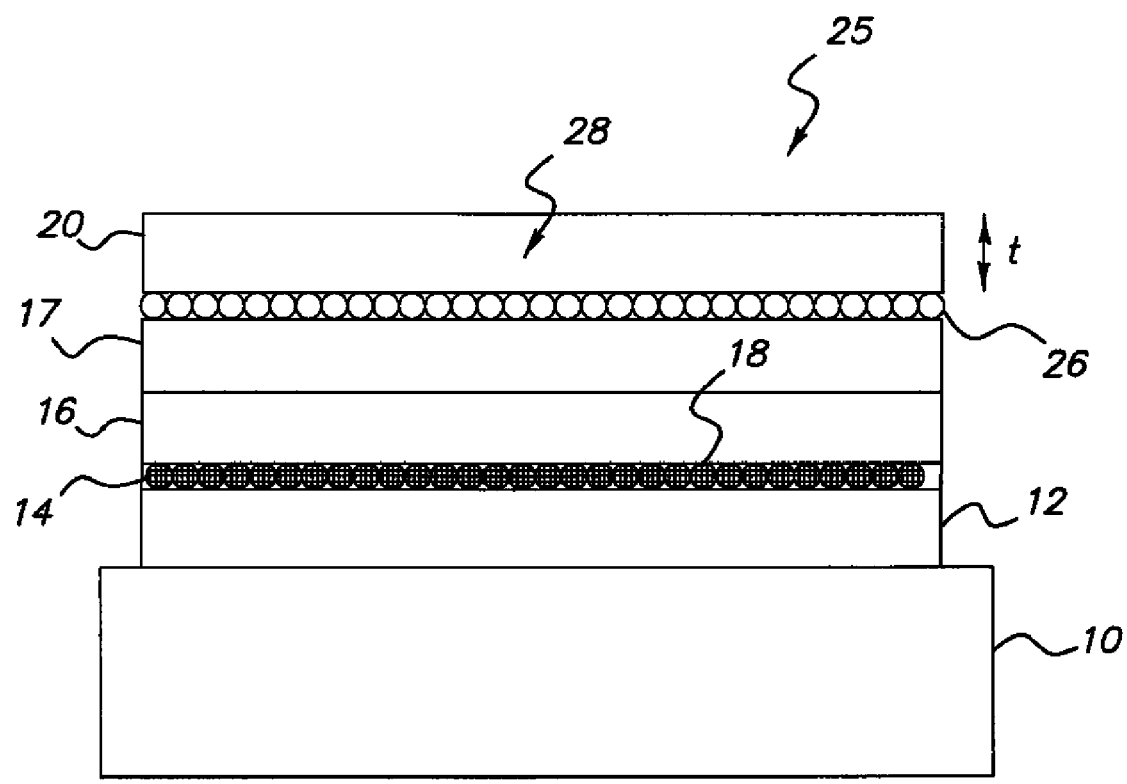
FIG. 9 is a cross section of a light-emissive device having a thin cover according to an alternative embodiment of the present invention.

In a further embodiment of the present invention, a cover may be provided over the colloidal light-emitting layer 14 and electrodes 12, 16 to protect the device. Referring to FIGS. 4, 9 the cover 20 may be coated directly on the second electrode 16, scattering layer 28 or other layers formed over the second electrode 16 (such as a protective layer 17). Alternatively, referring to FIG. 6, the cover 20 may be a second substrate affixed to the substrate 10 with a gap 19 formed between the second electrode 16 (or protective layer 17 or scattering layer 28) and the cover 20.

In further embodiments of the present invention, a low-index layer 36 may be provided to prevent light propagation in a relatively thick cover or substrate (much thicker than the layer 12, 14, 16, 22, 24) to maintain the sharpness of a pixilated device. The low-index layer 36 may comprise a solid layer, a void (for example, a vacuum), or a cavity. The cavity may be filled with a gas, for example, air or an inert gas such as nitrogen, argon or helium. Alternatively, a solid material, for example, a low-index polymer, may be employed, but such solid material must have an optical index lower than that of the light-emitting layers 14. Preferably, the low-index layer 36 is at least one micron thick, and more preferably at least two microns thick.

Referring to FIG. 6, in a further top-emitter embodiment of the present invention, the low-index layer 36 may be the gap 19 provided between the cover 20 and the light-scattering layer 28. The low-index layer 36 has a refractive index lower than the cover 20 refractive index. In such an embodiment, light emitted by the colloidal light-emitting layer 14 will be emitted into the transparent electrode 16 and any optional charge-management layers. Light 66 emitted at a small angle to the substrate 10 normal will emit from the device. However, light 68 emitted at a large angle to the substrate 10 normal will normally be trapped due to total internal reflection at the interface with the relatively lower index substrate 10 or cover 20. According to an embodiment of the present invention, some light will instead be trapped at the interface with the low-index layer 36. The trapped light will subsequently be scattered by the scattering particles 26 into a different angle and will either be emitted or trapped again until the light re-encounters the scattering particles 26 and is emitted from the device or absorbed. The low-index layer 36 ensures that light, once transmitted into the low-index layer 36, will not be trapped in the substrate 10 or cover 20. Since the other layers are relatively thin, trapped light will travel only a short distance before being scattered out of the device, thereby, maintaining the sharpness of the device.

Referring to FIGS. 10A and 10B, according to other top-emitter embodiments of the present invention, the low-index layer 36 may be a vacuum or the layer may be filled with a relatively low-refractive index gas and the light-scattering layer 28 comprises a plurality of relatively high-refractive index light-scattering transparent particles 26 projecting into the layer 36 without contacting the cover 20 and further comprising an adhesive binder 40 in contact with at least some of the light-scattering particles 26 to adhere the light-scattering particles 26 to the transparent electrode 16 or protection layer 17. As shown in FIGS. 10A and 10B, adhesive binder 40 adheres the light-scattering particles 26 to the transparent electrode 16 or protective layer 17. As shown in FIG. 10A, a minimal amount of adhesive binder 40 is employed to adhere the light-scattering particles 26 to the underlying layer. As shown in FIG. 10B, a greater quantity of adhesive binder 40 is employed to adhere the light-scattering particles 26 to the underlying layer such that some of the light-scattering particles 26 are completely immersed in the adhesive binder 40. In one embodiment of the present invention, however, at least a fraction of, and preferably most of, the light-scattering particles 26 project into the low-index layer 36 without contacting the cover 20.

Figure 7:
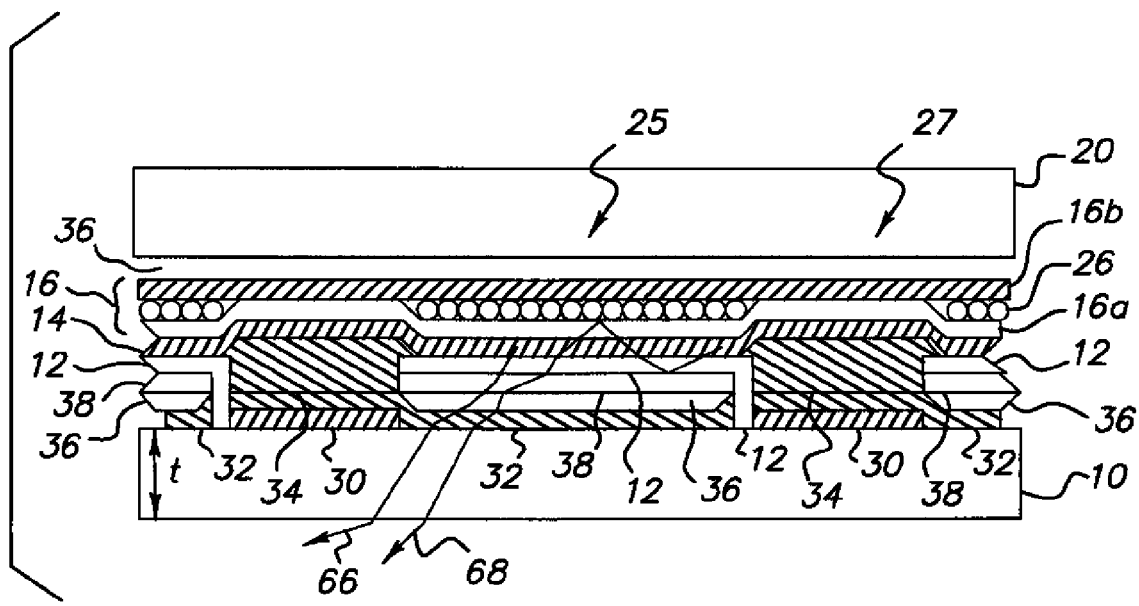
FIG. 7 is a cross section of a bottom-emitting, light-emissive device with conductive and reflective layers according to an alternative embodiment of the present invention.

Referring to FIG. 7, in a further bottom-emitter embodiment of the present invention, a low-index layer 36 may be provided between the substrate 10 and the light-scattering layer 28. The low-index layer 36 has a refractive index lower than the substrate 10 refractive index. In such an embodiment, light emitted by the colloidal light-emitting layer 14 will be emitted into the first electrode 12 and any optional charge-management layers. Light 66 emitted at a small angle to the substrate 10 normal will be emitted from the device. However, light 68 emitted at a large angle to the substrate 10 normal will normally be trapped due to total internal reflection at the interface with the relatively lower index substrate 10. According to an embodiment of the present invention, some light will instead be trapped at the interface with the low-index layer 36. The trapped light will subsequently be scattered by the scattering particles 26 into a different angle and will either be emitted or trapped again, until the light re-encounters the scattering particles 26 and is emitted from the device or absorbed. The low-index layer 36 ensures that light, once transmitted into the low-index layer 36, will not be trapped in the substrate 10. Since the other layers are relatively thin compared to the substrate 10, trapped light will travel only a short distance before being scattered out of the device, thereby maintaining the sharpness of the device.

FIG. 7 also illustrates the use of thin-film electronic components 30 for controlling the application of current to the electrodes 12 and 16. Planarization layers 32 and 34 are used to electrically isolate the electrodes and provide a smooth surface on which subsequent layers may be coated.

Figure 8:
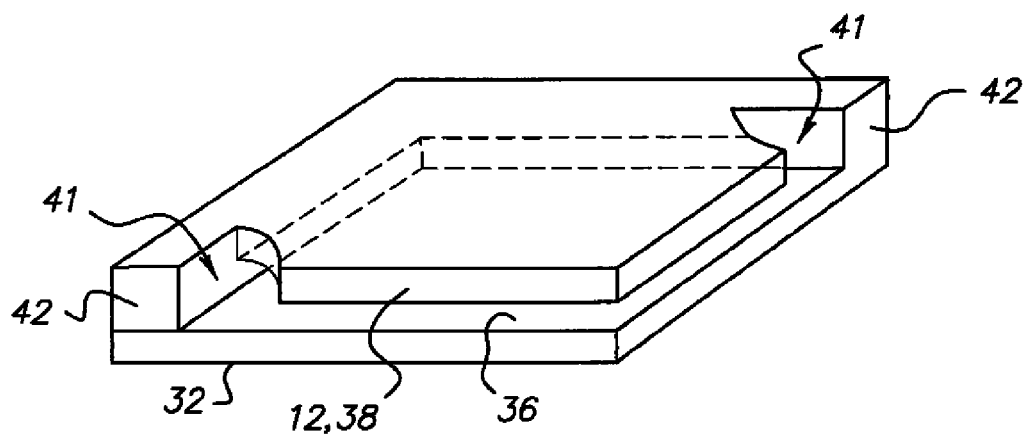
FIG. 8 is a perspective of an optical cavity forming a low-index layer according to an alternative embodiment of the present invention.

Referring to FIG. 7 and FIG. 8, in one embodiment of the present invention, the low-index layer 36 is an optical isolation layer formed over the substrate 10, wherein the first electrode 12 (now transparent) or a second layer 38 formed between the optical isolation layer 36 and the transparent electrode 12 comprises one or more openings 41 leading to the optical isolation layer 36, and the optical isolation layer 36 is formed by etching a sacrificial layer deposited between the substrate 10 and the transparent first electrode 12 or the second layer through the one or more openings 41. The planarization layer 32 may serve as the floor of the optical isolation layer 36 and walls 42 employed to support the transparent first electrode 12.

The optical isolation layer 36 may be formed by depositing a sacrificial layer (not shown) in the location of optical isolation layer 36 over for example, the insulating and planarizing layer 32. A second layer 38 may then be formed over the sacrificial layer, the second layer 38, having openings 41, exposing portions of the sacrificial layer. An etchant may then be employed to etch the materials of the sacrificial layer away, leaving a cavity beneath the second layer 38 forming the optical isolation layer 36. Further layers, for example the scattering layer 28 or first electrode 12 may be formed over the second layer 38. Alternatively, such layers as the scattering layer 28 or first electrode 12 may be employed as the second layer 38 and no intermediate, covering layer may be necessary to form a layer over the optical isolation layer 36. The second layer 38 may be supported over the cavity comprising the optical isolation layer 36 by walls 42 adjacent to the light-emitting areas 25 or by pillars of support material formed in the light-emissive area 25. The walls 42 or pillars may comprise the same materials as the second layer 38 and be formed in a common patterning step. In such an embodiment, the sacrificial layer is formed only in the light-emissive area 25.

Materials and etchants known in the photolithographic industry may be employed to form the sacrificial layer and/or second layer 38. In particular, the micro-electromechanical systems (MEMS) art describes useful techniques, as described in commonly assigned U.S. Pat. No. 6,238,581 entitled "Process for manufacturing an electromechanical grating device". This disclosure describes a method for manufacturing a mechanical grating device comprising the steps of: providing a spacer layer on top of a protective layer which covers a substrate; etching a channel entirely through the spacer layer; depositing a sacrificial layer at least as thick as the spacer layer; rendering the deposited sacrificial layer optically coplanar by chemical mechanical polishing; providing a tensile ribbon layer completely covering the area of the channel; providing a conductive layer patterned in the form of a grating; transferring the conductive layer pattern to the ribbon layer and etching entirely through the ribbon layer; and removing entirely the sacrificial layer from the channel. With respect to the present invention, such a process can be simplified since the requirement for chemical mechanical polishing and the grating structure are unnecessary. Likewise, U.S. Pat. No. 6,307,663 and, in particular, U.S. Pat. No. 6,663,788 describe further devices having cavities and methods for forming cavities useful in the present invention. For example, the sacrificial layer may comprise polysilicon, polyamide, or a silicon oxide. The second layer 38 may comprise a silicon nitride, a silicon oxide, or a metal oxide. The choice of materials will depend greatly on the choice of etchants, for example, $XeF_2$ can etch polysilicon. Suitable cavities may be formed by employing a sacrificial layer of polysilicon formed over a silicon dioxide layer with a second layer of silicon nitride having photolithographically patterned openings exposing portions of the first sacrificial layer and then etching away the polysilicon sacrificial layer using $XeF_2$ gas. In an alternative embodiment, the sacrificial layer may be silicon dioxide covered with indium tin oxide (ITO) and hydrofluoric acid employed to etch out the silicon dioxide sacrificial layer. In such an embodiment, the ITO layer may serve as a transparent electrode, thus combining second layer 38 and first electrode 12 into a common layer that may reduce materials costs, processing steps, and improve optical performance by avoiding light absorption in the second layer 38.

Once formed, the cavity may be filled with a gas, left as a vacuum, or the openings employed to fill the cavity with a solid material, for example a low-index polymer. In an alternative process, a low-index material may first be formed and the remainder of the OLED structure formed over the low-index material. Preferably, the low-index material may have a refractive index close to one, for example, an aerogel may be employed. Such an aerogel may be formed, for example, by employing a sol-gel process with MgF to make a coating with a refractive index of 1.15 using nano-particles. Suitable materials and processes are known in the art.

In yet another embodiment of the present invention, a plurality of spaced-apart light-emitting elements 25 emitting a common color of light may be formed over the substrate. As shown in FIGS. 3 and 7, the first electrode 12 (transparent for this embodiment) is patterned to form light-emitting areas 25 separated by non-light-emitting areas 27. The colloidal light-emitting layer 14 may be likewise patterned to match the light-emitting areas 25 and the areas 25 provided with different light-emitting materials to form a full-color pixilated display device emitting light of different colors, for example, red, green, blue, or white. The differently colored areas may be, for example, sequentially arranged in stripes so that areas 25 emitting the same color of light are spaced apart and may be separated by emitters of different colors.

The distance that trapped light may propagate in a layer may be described as $$W_A = t \frac{\pi - 2\theta_C + \sin(2\theta_C)}{\cos^2(\theta_C)}$$

where $W_A$ is the average lateral propagation light at each internal reflection and $\theta C$ is the critical angle for glass to air. For the specific case of index 1.5, one can now state that of the 55.6% of the light that is reflected back to the scattering layer, that the average lateral propagation is equal to 4.82*t where t is the thickness of the layer. Of that light, 44.4% will refract directly to the air with no additional lateral propagation, and 55.6% will experience lateral propagation of 4.82*t. The second lateral propagation will be at a random angle relative to the first lateral propagation, so the addition will not be linear, but the two will add in quadrature (i.e. square root of the sum of the squares). The following table follows the average lateral propagation and fraction of the light escaping after each total reflection for n=1.5.

| Pass # | Fraction Escaping | Average lateral propagation | Fraction Returning |
| --- | --- | --- | --- |
| 1 | 44.44% | 0 t | 55.56% |
| 2 | 24.69% | 4.8 t | 30.87% |
| 3 | 13.72% | 6.8 t | 17.15% |
| 4 | 7.62% | 8.3 t | 9.53% |
| 5 | 3.39% | 9.6 t | 6.14% |

These results are now interpreted and applied to various embodiments of the present invention. Had there been no scattering layer, only about 20% to 30% of the generated light would have escaped, and the average lateral propagation would be zero. The off-axis rays would propagate laterally while traversing the glass substrate, but the viewer's eye is located at a unique angular value of θ and all the rays emerging at that angle have exactly the same lateral propagation, so the eye re-creates a precise image. That is why the lateral propagation of light traversing the glass on the first pass can be ignored. The image degradation results from the random direction change which occurs when the light reflects back to the scattering layer. From the table one sees that for this non-absorbing model, 100% of the light generated eventually escapes, but 5 to 10 reflections within the glass are required.

The lateral propagation is proportional to the thickness of the glass, t. Reducing t to the size of the pixel pitch reduces the lateral propagation proportionately. More than half of the escaping light will experience a lateral propagation of nearly 5t, and 10% of the light will propagate laterally by more than 10t. An exact curve of lateral propagation probability versus lateral propagation distance could be calculated using the sophisticated model alluded to above. If a human viewer is sensitive to degradation wherein 50% of the light scatters by twice the pixel pitch, then one would desire that the layer have a thickness t which is less than half of the pixel pitch.

For a real medium with absorption, the amount of light escaping is reduced, and the amount of image degradation is reduced. Furthermore, most scattering layers are not fully Lambertian and suffer from reduced scattering at high angles. This further reduces the magnitude of image degradation. An advantageous range for real devices would be a t value equal to the pixel pitch, that is the thickness of the cover 20 or substrate 10 is the maximum distance between corresponding points in neighboring pixels emitting the same color of light.

An acceptable range of t is less than or equal to twice the pixel pitch, that is the thickness of at least one of the substrate 10 or cover 20 through which light is emitted is less than or equal to two times the pixel pitch. Hence, in such an application (FIGS. 3, 4), it may be desirable to limit the thickness of the substrate 10 or cover 20, for example, to twice the distance t between the light-emitting elements emitting the same color of light to enhance the sharpness of the display.

Through experiment, applicants have discovered that, for optimal efficiency, the light-scattering layer 28 should have a thickness of between 300 nm and 3 microns. Moreover, the light-scattering layer 28 may comprise light-scattering particles 26 wherein the average ratio of the volume of light-scattering particles 26 to the volume of the layer is greater than 0.55.

In one structure according to an embodiment of the present invention, the light-emissive particles 18 are formed in a thin layer, for example a mono-layer. Such a mono-layer may improve the transfer of energy into the light-emissive particles 18.

By providing charge-control layers 22, 24 or a transparent conducting layer 16a, the light-emissive particles 18 may be located at a distance from any metal layers (e.g. a reflective electrode) to ensure, for example, that interactions between a reflective, metal layer and the light-emitting particles 18 causing surface plasmon effects do not occur, thereby improving the efficiency of the device. For example, the thickness of charge-control layers 22, 24 or a transparent conducting layer 12a or 16a may be the greater than or equal to the thickness of the wavelength of the light emitted by the particles 18, or at least, for example, 500 nm.

According to various embodiments of the present invention, the layers 12, 14, 16, 22, 24 may be formed by coating over the substrate 10. Alternatively, the substrate 10 may be considered to be a layer coated over the layers 12, 14, 16, 22, 24, as illustrated in FIG. 4. Referring to FIGS. 4, 6, 7, and 9, a device of the present invention may comprise two substrates 20 and 10, on one of which the layers are formed. However, with respect to the relative locations of the various layers and the structure of the present invention, either of the two substrates 10 and 20 may be considered to be the substrate, upon which the multilayered structure is built.

The scattering layer 28 can employ a variety of materials. For example, randomly located spheres of titanium dioxide may be employed in a matrix of polymeric material. Alternatively, a more structured arrangement employing ITO, silicon oxides, or silicon nitrides may be used. In a further embodiment, the refractive materials may be incorporated into the electrode itself so that the electrode is a scattering layer. Shapes of refractive elements may be cylindrical, rectangular, or spherical, but it is understood that the shape is not limited thereto. The difference in refractive indices between materials in the scattering layer 28 may be, for example, from 0.3 to 3, and a large difference is generally desired. The thickness of the scattering layer, or size of features in, or on the surface of, a scattering layer may be, for example, 0.03 to 50 μm. It is generally preferred to avoid diffractive effects in the scattering layer. Such effects may be avoided, for example, by locating features randomly or by ensuring that the sizes or distribution of the refractive elements are not the same as the wavelength of the color of light emitted by the device from the light-emitting area.

Materials of the light-scattering layer 28 can include organic materials (for example, polymers or electrically conductive polymers) or inorganic materials. The organic materials may include, e.g., one or more of polythiophene, PEDOT, PET, or PEN. The inorganic materials may include, e.g., one or more of $SiO_x$ (x>1), $SiN_x$ (x>1), $Si_3N_4$, $TiO_2$, MgO, ZnO, $Al_2O_3$, $SnO_2$, $In_2O_3$, $MgF_2$, and $CaF_2$. The scattering layer 28 may comprise, for example, silicon oxides and silicon nitrides having a refractive index of 1.6 to 1.8 and doped with titanium dioxide having a refractive index of 2.5 to 3. Polymeric materials having refractive indices in the range of 1.4 to 1.6 may be employed having a dispersion of refractive elements of material with a higher refractive index, for example, titanium dioxide.

Figure 11:
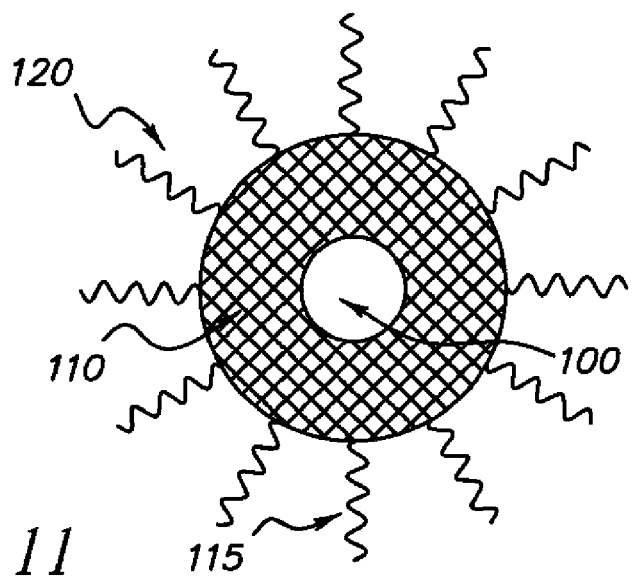
FIG. 11 is a cross section of a light-emitting particle according to an embodiment of the present invention.

In further embodiments of the present invention and as illustrated in FIG. 11, conductive, non-emissive particles 140 may be located in the colloidal light-emitting layer 14. The particles 140 may have a higher conductivity and may improve transfer of energy into the light-emissive particles 18. Such conductive particles, for example, nano-particles, are known in the art. Agglomerations 130 of light-emissive particles 18 and, optionally, conductive, non-emissive particles 140 may by considered to be within the present invention, as single particles located within the light-emissive layer 14.

Figure 12:
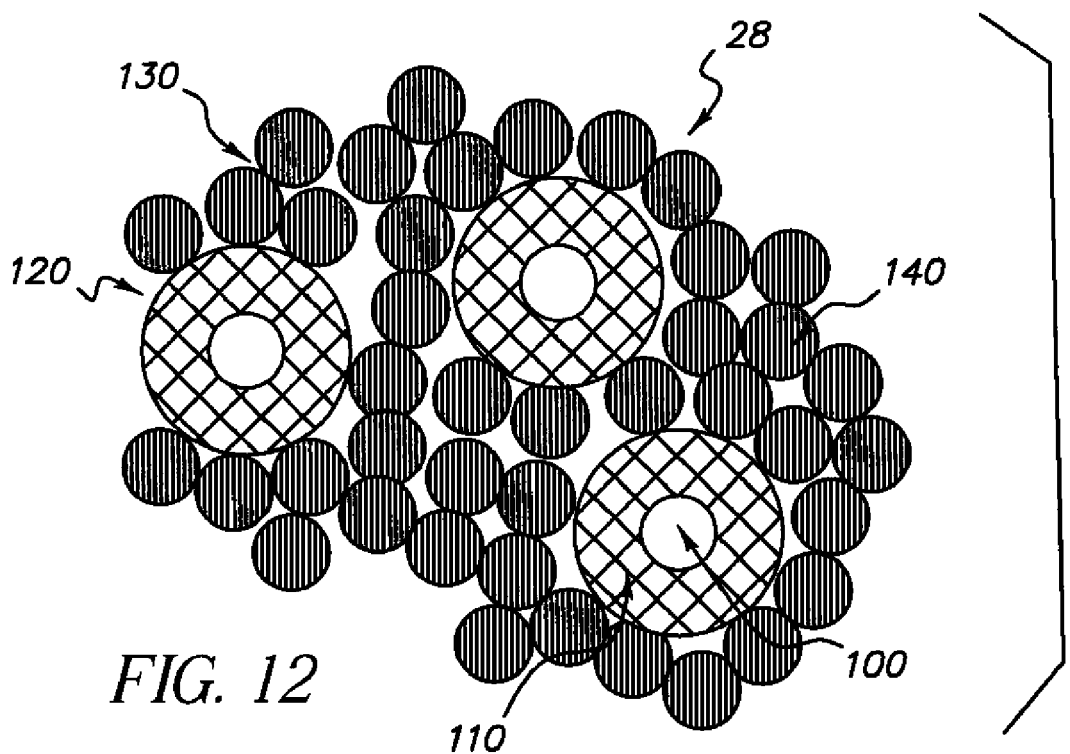
FIG. 12 is a cross section of an agglomeration of colloidal light-emitting and conducting particles according to an embodiment of the present invention.

Referring to FIGS. 11 and 12, for one embodiment of the present invention, the light-emissive particles 18 are quantum dots. Using quantum dots as the emitters in light-emitting diodes confers the advantage that the emission wavelength can be simply tuned by varying the size of the quantum dot particle. As such, spectrally narrow (resulting in a larger color gamut), multi-color emission can occur. If the quantum dots are prepared by colloidal methods [and not grown by high vacuum deposition techniques (S. Nakamura et al., Electronics Letter 34, 2435 (1998))], then the substrate no longer needs to be expensive or lattice matched to the LED semiconductor system. For example, the substrate could be glass, plastic, metal foil, or Si. Forming quantum dot LEDs using these techniques is highly desirably, especially if low cost deposition techniques are used to deposit the LED layers.

A schematic of a core/shell quantum dot 120 emitter is shown in FIG. 11. The particle contains a light-emitting core 100, a semiconductor shell 110, and organic ligands 115. Since the size of typical quantum dots is on the order of a few nanometers and commensurate with that of its intrinsic exciton, both the absorption and emission peaks of the particle are blue-shifted relative to bulk values (R. Rossetti et al., Journal of Chemical Physics 79, 1086 (1983)). As a result of the small size of the quantum dots, the surface electronic states of the dots have a large impact on the dot's fluorescence quantum yield. The electronic surface states of the light-emitting core 100 can be passivated either by attaching appropriate (e.g., primary amines) organic ligands 115 to its surface or by epitaxially growing another semiconductor (the semiconductor shell 110) around the light-emitting core 100. The advantages of growing the semiconductor shell 110 (relative to organically passivated cores) are that both the hole and electron core particle surface states can be simultaneously passivated, the resulting quantum yields are typically higher, and the quantum dots are more photostable and chemically robust. Because of the limited thickness of the semiconductor shell 110 (typically 1-2 monolayers), its electronic surface states also need to be passivated. Again, organic ligands 115 are the common choice. Taking the example of a CdSe/ZnS core/shell quantum dot 120, the valence and conduction band offsets at the core/shell interface are such that the resulting potentials act to confine both the holes and electrons to the core region. Since the electrons are typically lighter than the heavy holes, the holes are largely confined to the cores, while the electrons penetrate into the shell and sample its electronic surface states associated with the metal atoms (R. Xie et al., Journal of the American Chemical Society, 127, 7480 (2005)). Accordingly, for the case of CdSe/ZnS core/shell quantum dots 120, only the shell's electron surface states need to be passivated; an example of a suitable organic ligand 115 would be one of the primary amines which forms a donor/acceptor bond to the surface Zn atoms (X. Peng et al., Journal of the American Chemical Society, 119, 7019 (1997)). In summary, typical highly luminescent quantum dots have a core/shell structure (higher bandgap surrounding a lower band gap) and have non-conductive organic ligands 115 attached to the shell's surface.

Colloidal dispersions of highly luminescent core/shell quantum dots have been fabricated by many workers over the past decade (O. Masala and R. Seshadri, Annual Review of Materials Research 34, 41 (2004)). The light-emitting core 100 is composed of type IV (Si), III-V (InAs), or II-VI (CdTe) semiconductive material. For emission in the visible part of the spectrum, CdSe is a preferred core material since by varying the diameter (1.9 to 6.7 nm) of the CdSe core; the emission wavelength can be tuned from 465 to 640 nm. As is well-known in the art, visible emitting quantum dots can be fabricated from other material systems, such as, doped ZnS (A. A. Bol et al., Phys. Stat. Sol. B224, 291 (2001)). The light-emitting cores 100 are made by chemical methods well known in the art. Typical synthetic routes are decomposition of molecular precursors at high temperatures in coordinating solvents, solvothermal methods (disclosed by O. Masala and R. Seshadri, Annual Review of Materials Research, 34, 41 (2004)), and arrested precipitation (disclosed by R. Rossetti et al., Journal of Chemical Physics, 80, 4464 (1984)). The semiconductor shell 110 is typically composed of type II-VI semiconductive material, such as, CdS or ZnSe. The shell semiconductor is typically chosen to be nearly lattice matched to the core material and have valence and conduction band levels such that the core holes and electrons are largely confined to the core region of the quantum dot. Preferred shell material for CdSe cores is $ZnSe_xS_{1-x}$, with x varying from 0.0 to ~0.5. Formation of the semiconductor shell 110 surrounding the light emitting core 100 is typically accomplished via the decomposition of molecular precursors at high temperatures in coordinating solvents (M. A. Hines et al., Journal of Physical Chemistry, 100, 468 (1996)) or reverse micelle techniques (A. R. Kortan et al., Journal of the American Chemical Society, 112, 1327 (1990)).

As is well known in the art, two low-cost means for forming quantum dot films is depositing the colloidal dispersion of core/shell quantum dots 120 by drop casting and spin casting. Alternatively, spray deposition may be employed. Common solvents for drop casting quantum dots are a 9:1 mixture of hexane:octane (C. B. Murray et al., Annual Review of Materials Science, 30, 545 (2000)). The organic ligands 115 need to be chosen such that the quantum dot particles are soluble in hexane. As such, organic ligands with hydrocarbon-based tails are good choices, such as, the alkylamines. Using well-known procedures in the art, the ligands coming from the growth procedure (TOPO, for example) can be exchanged for the organic ligand 115 of choice (C. B. Murray et al., Annual Review of Materials Science, 30, 545 (2000)). When depositing a colloidal dispersion of quantum dots, the requirements of the solvent are that it easily spreads on the deposition surface and the solvents evaporate at a moderate rate during the deposition process. It was found that alcohol-based solvents are a good choice; for example, combining a low boiling point alcohol, such as, ethanol, with higher boiling point alcohols, such as, a butanol-hexanol mixture, results in good film formation. Correspondingly, ligand exchange can be used to attach an organic ligand (to the quantum dots) whose tail is soluble in polar solvents; pyridine is an example of a suitable ligand. The quantum dot films resulting from these two deposition processes are luminescent, but non-conductive. The films are resistive since non-conductive organic ligands separate the core/shell quantum dot 120 particles. The films are also resistive since as mobile charges propagate along the quantum dots, the mobile charges get trapped in the core regions due to the confining potential barrier of the semiconductor shell 110.

Figure 13:
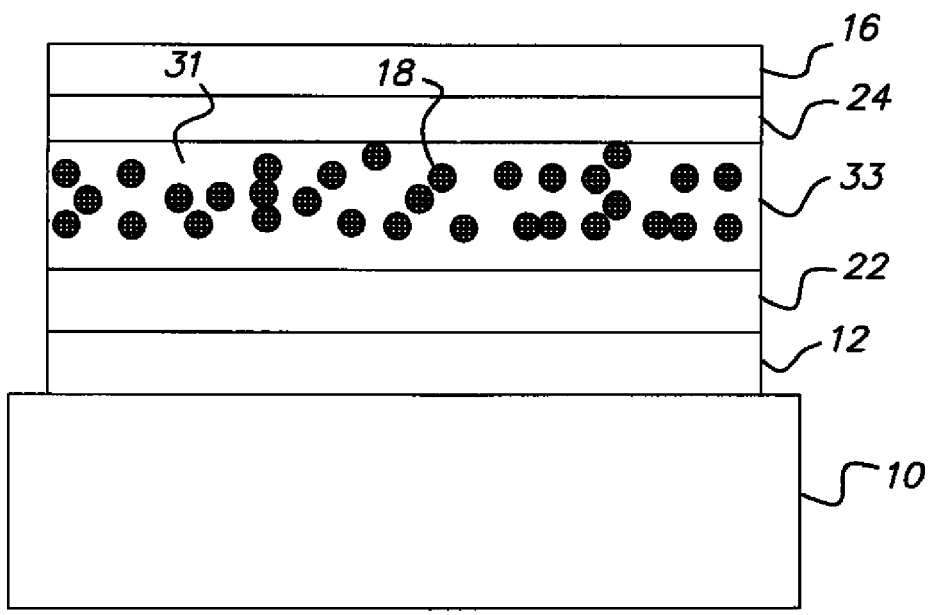
FIG. 13 is a cross section of a prior-art light-emissive device.
Figure 14:
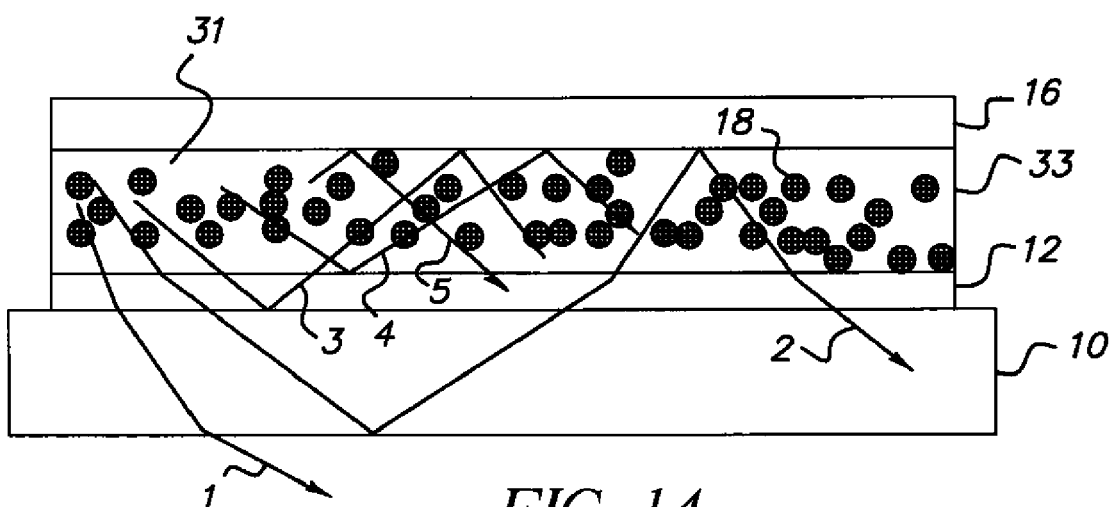
FIG. 14 is a cross section of a prior-art light-emissive device illustrating light trapping.

Proper operation of inorganic LEDs typically requires low resistivity n-type and p-type transport layers, surrounding a conductive (nominally doped) and luminescent emitter layer. As discussed above, typical quantum dot films are luminescent, but insulating. FIG. 13 schematically illustrates a way of providing an inorganic light-emitting layer 14 that is simultaneously luminescent and conductive. The concept is based on co-depositing small (<2 nm), conductive inorganic nanoparticles 140 along with the core/shell quantum dots 120 to form the inorganic colloidal light-emitting layer 14. A subsequent inert gas (Ar or $N_2$) anneal step is used to sinter the smaller inorganic nanoparticles 140 amongst themselves and onto the surface of the larger core/shell quantum dots 120. Sintering the inorganic nanoparticles 140, results in the creation of a conductive semiconductor agglomeration 130 useful in layer 14 or forming a matrix in layer 14. Through the sintering process, this agglomeration 130 is also connected to the core/shell quantum dots 120. As such, a conductive path is created from the edges of the inorganic colloidal light-emitting layer 14, through the semiconductor agglomeration 130 and to each core/shell quantum dot 120, where electrons and holes recombine in the light emitting cores 100. It should also be noted that encasing the core/shell quantum dots 120 in the conductive semiconductor agglomeration 130 and by layers 22 has the added benefit that it protects the quantum dots environmentally from the effects of both oxygen and moisture.

The inorganic nanoparticles 140 need to be composed of conductive semiconductive material, such as, type IV (Si), III-V (GaP), or II-VI (ZnS or ZnSe) semiconductors. In order to easily inject charge into the core/shell quantum dots 120, it is preferred that the inorganic nanoparticles 140 be composed of a semiconductor material with a band gap comparable to that of the semiconductor shell 110 material, more specifically a band gap within 0.2 eV of the shell material's band gap. For the case that ZnS is the outer shell of the core/shell quantum dots 120, then the inorganic nanoparticles 140 are composed of ZnS or ZnSSe with a low Se content. The inorganic nanoparticles 140 are made by chemical methods well known in the art. Typical synthetic routes are decomposition of molecular precursors at high temperatures in coordinating solvents, solvothermal methods (O. Masala and R. Seshadri, Annual Review of Materials Research, 34, 41 (2004)), and arrested precipitation (R. Rossetti et al., Journal of Chemical Physics, 80, 4464 (1984)). As is well known in the art, nanometer-sized nanoparticles melt at a much reduced temperature relative to their bulk counterparts (A. N. Goldstein et al., Science 256, 1425 (1992)). Correspondingly, it is desirable that the inorganic nanoparticles 140 have diameters less than 2 nm in order to enhance the sintering process, with a preferred size of 1-1.5 nm. With respect to the larger core/shell quantum dots 120 with ZnS shells, it has been reported that 2.8 nm ZnS particles are relatively stable for anneal temperatures up to 350° C. (S. B. Qadri et al., Physical Review B60, 9191 (1999)). Combining these two results, the anneal process has a preferred temperature between 250 and 300° C. and a duration up to 60 minutes, which sinters the smaller inorganic nanoparticles 140 amongst themselves and onto the surface of the larger core/shell quantum dots 120, whereas the larger core/shell quantum dots 120 remain relatively stable in shape and size.

To form an inorganic colloidal light-emitting layer 14, a co-dispersion of inorganic nanoparticles 140 and core/shell quantum dots 120 may be formed. Since it is desirable that the core/shell quantum dots 120 be surrounded by the inorganic nanoparticles 140 in the inorganic colloidal light-emitting layer 14, the ratio of inorganic nanoparticles 140 to core/shell quantum dots 120 is chosen to be greater than 1:1. A preferred ratio is 2:1 or 3:1. Depending on the deposition process, such as, spin casting or drop casting, an appropriate choice of organic ligands 115 is made. Typically, the same organic ligands 115 are used for both types of particles. In order to enhance the conductivity (and electron-hole injection process) of the inorganic light emitting layer 14, it is preferred that the organic ligands 115 attached to both the core/shell quantum dots 120 and the inorganic nanoparticles 140 evaporate as a result of annealing the inorganic light emitting layer 14 in an inert atmosphere. By choosing the organic ligands 115 to have a low boiling point, they can be made to evaporate from the film during the annealing process (C. B. Murray et al., Annual Review of Material Science 30, 545 (2000)). Consequently, for films formed by drop casting, shorter chained primary amines, such as, hexylamine are preferred; for films formed by spin casting, pyridine is a preferred ligand. Annealing thin films at elevated temperatures can result in cracking of the films due to thermal expansion mismatches between the film and the substrate. To avoid this problem, it is preferred that the anneal temperature be ramped from 25° C. to the anneal temperature and from the anneal temperature back down to room temperature. A preferred ramp time is on the order of 30 minutes. The thickness of the resulting inorganic colloidal light-emitting layer 14 should be between 10 and 100 nm.

Following the anneal step, the core/shell quantum dots 120 would be devoid of an outer shell of organic ligands 115. For the case of CdSe/ZnS quantum dots, having no outer ligand shell would result in a loss of free electrons due to trapping by the shell's unpassivated surface states (R. Xie, Journal of American Chemical Society 127, 7480 (2005)). Consequently, the annealed core/shell quantum dots 120 would show a reduced quantum yield compared to the unannealed dots. To avoid this situation, the ZnS shell thickness needs to be increased to such an extent whereby the core/shell quantum dot electron wavefunction no longer samples the shell's surface states. Using calculational techniques well known in the art (S. A. Ivanov et al., Journal of Physical Chemistry 108, 10625 (2004)), the thickness of the ZnS shell needs to be at least 5 monolayers (ML) thick in order to negate the influence of the electron surface states. However, up to a 2 ML thick shell of ZnS can be directly grown on CdSe without the generation of defects due to the lattice mismatch between the two semiconductor lattices (D. V. Talapin et al., Journal of Physical Chemistry 108, 18826 (2004)). To avoid the lattice defects, an intermediate shell of ZnSe can be grown between the CdSe core and the ZnS outer shell. This approach was taken by Talapin et al. (D. V. Talapin et al., Journal of Physical Chemistry, B108, 18826 (2004)), where they were able to grow up to an 8 ML thick shell of ZnS on a CdSe core, with an optimum ZnSe shell thickness of 1.5 ML. More sophisticated approaches can also be taken to minimize the lattice mismatch difference, for instance, smoothly varying the semiconductor content of the intermediate shell from CdSe to ZnS over the distance of a number of monolayers (R. Xie et al., Journal of the American Chemical Society, 127, 7480 (2005)). In sum the thickness of the outer shell is made sufficiently thick so that neither free carrier samples the electronic surface states. Additionally, if necessary, intermediate shells of appropriate semiconductor content are added to the quantum dot in order to avoid the generation of defects associated with thick semiconductor shells 110.

As a result of surface plasmon effects (K. B. Kahen, Applied Physics Letter 78, 1649 (2001)), having metal layers adjacent to emitter layers results in a loss in emitter efficiency. Consequently, it is advantageous to space the emitters' layers from any metal contacts by sufficiently thick (at least 150 nm) charge transport layers (e.g. 22, 24) or conductive layers (e.g. 12a, 16a). Finally, not only do transport layers inject electron and holes into the emitter layer, but, by proper choice of materials, they can prevent the leakage of the carriers back out of the emitter layer. For example, if the inorganic nanoparticles 140 were composed of $ZnS_{0.5}Se_{0.5}$ and the transport layers were composed of ZnS, then the electrons and holes would be confined to the emitter layer by the ZnS potential barrier. Suitable materials for the p-type transport layer include II-VI and III-V semiconductors. Typical II-VI semiconductors are ZnSe, ZnS, or ZnTe. Only ZnTe is naturally p-type, while ZnSe and ZnS are n-type. To get sufficiently high p-type conductivity, additional p-type dopants should be added to all three materials. For the case of II-VI p-type transport layers, possible candidate dopants are lithium and nitrogen. For example, it has been shown in the literature that $Li_3N$ can be diffused into ZnSe at ~350° C. to create p-type ZnSe, with resistivities as low as 0.4 ohm-cm (S. W. Lim, Applied Physics Letters 65, 2437 (1994)).

Suitable materials for n-type transport layers include II-VI and III-V semiconductors. Typical II-VI semiconductors are ZnSe or ZnS. As for p-type transport layers, to get sufficiently high n-type conductivity, additional n-type dopants should be added to the semiconductors. For the case of II-VI n-type transport layers, possible candidate dopants are the Type III dopants of Al, In, or Ga. As is well known in the art, these dopants can be added to the layer either by ion implantation (followed by an anneal) or by a diffusion process (P. J. George et al., Applied Physics Letter 66, 3624 [1995]). A more preferred route is to add the dopant in-situ during the chemical synthesis of the nanoparticle. Taking the example of ZnSe particles formed in a hexadecylamine (HDA)/TOPO coordinating solvent (M. A. Hines et al., Journal of Physical Chemistry B102, 3655 [1998]), the Zn source is diethylzinc in hexane and the Se source is Se powder dissolved in TOP (forming TOPSe). If the ZnSe were to be doped with Al, then a corresponding percentage (a few percent relative to the diethylzinc concentration) of trimethylaluminum in hexane would be added to a syringe containing TOP, TOPSe, and diethylzinc. In-situ doping processes, like these, have been successfully demonstrated when growing thin films by a chemical bath deposition process (J. Lee et al., Thin Solid Films 431-432, 344 [2003]).

The invention has been described in detail with particular reference to certain preferred embodiments thereof, but it will be understood that variations and modifications can be effected within the spirit and scope of the invention.

PARTS LIST

| | |
|---|---|
| 1, 2, 3, 4, 5 | light rays |
| 10 | substrate |
| 12 | first electrode (transparent or reflective) |
| 12a | transparent conductive layer |
| 12b | reflective layer |
| 14 | colloidal light-emitting layer |
| 16 | second electrode (transparent or reflective) |
| 16a | transparent conductive layer |
| 16b | reflective layer |
| 17 | protective layer |
| 18 | light-emitting particles |
| 19 | gap |
| 20 | cover |
| 22 | charge-injecting, -transport, or -blocking layer |
| 24 | charge-injecting, -transport, or -blocking layer |
| 25 | light-emitting element |
| 26 | light-scattering particles |
| 27 | spacing between light-emitting elements |
| 28 | light-scattering layer |
| 30 | thin-film electronic components |
| 31 | organic light-emitting material |
| 32 | planarization and insulating layer |
| 33 | light-emissive layer |
| 34 | planarization and insulating layer |
| 36 | low-index layer, optical isolation layer |
| 38 | second layer |
| 40 | adhesive binder |
| 41 | openings |
| 42 | walls |
| 66, 68 | light |
| 100 | light-emitting core |
| 110 | shell |
| 115 | organic ligands |
| 120 | quantum dots |
| 130 | particle agglomeration |
| 140 | inorganic conductive nanoparticles |
| t | layer thickness |

The invention claimed is:

1. A light-emissive device comprising:
a substrate;
a first electrode formed on the substrate;
a colloidal light-emitting layer comprising inorganic, light-emissive particles formed over the first electrode;
a second electrode formed over the colloidal light-emitting layer;
wherein the first electrode is transparent and has a refractive index substantially equal to or greater than the refractive index of the colloidal light-emitting layer;
a light-scattering layer formed on a side of the transparent electrode opposite the colloidal light-emitting layer, and
wherein the second electrode comprises a transparent, conductive layer and a reflective conductive layer having a conductivity greater than the transparent conductive layer, and wherein the light-scattering layer is formed on only a first portion of the transparent conductive layer between the transparent conductive layer and the reflective conductive layer, and the reflective conductive layer is in electrical contact with the transparent conductive layer in a second portion of the transparent conductive layer.

2. The light-emissive device of claim 1, further comprising an electrically conductive protective layer formed between the transparent, conductive layer and the light-scattering layer.

3. A light-emissive device comprising,
a substrate;
a first electrode formed on the substrate;
a colloidal light-emitting layer comprising inorganic, light-emissive particles formed over the first electrode;
a second electrode formed over the colloidal light-emitting layer;

wherein the first electrode is transparent and has a refractive index substantially equal to or greater than the refractive index of the colloidal light-emitting layer;

a light-scattering layer formed on a side of the transparent electrode opposite the colloidal light-emitting layer; and wherein the substrate is transparent and further comprising a low-index layer having a refractive index lower than the substrate refractive index located between the first electrode and the substrate, and wherein the colloidal light-emitting layer further comprises non-light-emitting, conductive particles, and wherein the substrate has a refractive index less than those of the transparent electrode and the colloidal light-emitting layer.

4. The light-emissive device of claim 3, wherein the low-index layer is an optical isolation cavity formed over the substrate wherein the transparent electrode or a second layer formed between the optical isolation cavity and the transparent electrode comprises one or more openings leading to the optical isolation cavity, and the cavity is formed by etching a sacrificial layer deposited between the substrate and the transparent electrode or the second layer through the one or more openings.

5. The light-emissive device of claim 3 further comprising one or more charge-injection, -transport, and/or -blocking layers formed between the colloidal light-emitting layer and either of the electrodes and wherein the charge-injection, -transport, and/or -blocking layers have an refractive index substantially equal to or greater than the light-emissive layer refractive index and substantially equal to or less than the transparent electrode refractive index.

6. A light-emissive device comprising,
a substrate;
a first electrode formed on the substrate;
a colloidal light-emitting layer comprising inorganic, light-emissive particles formed over the first electrode;
a second electrode formed over the colloidal light-emitting layer;
wherein at least one of the first and second electrodes is transparent and wherein the transparent electrode has a refractive index substantially equal to or greater than the refractive index of the colloidal light-emitting layer;
a charge control layer between the first and second electrodes, a refraction index of the charge control layer in a range from that of the colloidal light emitting layer to that of the transparent electrode; and
a light-scattering layer formed on a side of the transparent electrode opposite the colloidal light-emitting layer, and wherein the colloidal light-emitting layer further comprises non-light-emitting, conductive particles.

7. The light-emissive device of claim 6, wherein the charge control layer is a charge injection layer, a charge transport layer, or a charge blocking layer.

8. The light-emissive device of claim 6, wherein the inorganic, light emissive particles are quantum dots.

9. The light-emissive device of claim 6, wherein the non-light-emitting, conductive particles are sintered to the light-emitting particles.

* * * * *